(12) United States Patent
Sel et al.

(10) Patent No.: US 8,372,711 B2
(45) Date of Patent: Feb. 12, 2013

(54) METHODS OF FABRICATING SEMICONDUCTOR DEVICES WITH SIDEWALL CONDUCTIVE PATTERNS

(75) Inventors: Jong-Sun Sel, Gyeonggi-do (KR); Jung-Dal Choi, Gyeonggi-do (KR); Joon-Hee Lee, Gyeonggi-do (KR); Hwa-Kyung Shin, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/110,113

(22) Filed: May 18, 2011

(65) Prior Publication Data

US 2011/0217835 A1    Sep. 8, 2011

Related U.S. Application Data

(60) Division of application No. 12/133,146, filed on Jun. 4, 2008, now Pat. No. 7,973,354, which is a continuation of application No. 11/241,458, filed on Sep. 30, 2005, now Pat. No. 7,397,093.

(30) Foreign Application Priority Data

Nov. 4, 2004  (KR) .................. 10-2004-0089435

(51) Int. Cl.
*H01L 21/336* (2006.01)
(52) U.S. Cl. . 438/257; 438/211; 257/316; 257/E27.103; 257/E29.3
(58) Field of Classification Search .............. 438/201, 438/211, 257; 257/314–316, 390, E27.103, 257/E21.69, E29.129, E29.3; 365/185.11, 365/185.17, 185.33
See application file for complete search history.

(56) References Cited

U.S. PATENT DOCUMENTS

| | | | |
|---|---|---|---|
| 4,780,431 A | 10/1988 | Maggioni et al. | |
| 5,023,679 A | 6/1991 | Shibata | |
| 5,034,791 A * | 7/1991 | Kameyama et al. | 257/332 |
| 6,221,717 B1 | 4/2001 | Cremonesi et al. | |
| 7,012,295 B2 | 3/2006 | Sato et al. | |
| 7,061,044 B2 * | 6/2006 | Park et al. | 257/319 |
| 2004/0026748 A1 | 2/2004 | Goda et al. | |

FOREIGN PATENT DOCUMENTS

JP    2000-164834 A    6/2000
KR    10-2002-0065113 A    8/2002

OTHER PUBLICATIONS

Notice to File a Response/Amendment to the Examination Report, Korean Application No. 10-2004-0089435, Mar. 27, 2006.

* cited by examiner

*Primary Examiner* — David Vu
(74) *Attorney, Agent, or Firm* — Myers Bigel Sibley & Sajovec, P.A.

(57) ABSTRACT

A gate pattern is disclosed that includes a semiconductor substrate, a lower conductive pattern, an upper conductive pattern, and a sidewall conductive pattern. The lower conductive pattern is on the substrate. The insulating pattern is on the lower conductive pattern. The upper conductive pattern is on the insulating pattern opposite to the lower conductive pattern. The sidewall conductive pattern is on at least a portion of sidewalls of the upper conductive pattern and the lower conductive pattern. The sidewall conductive pattern electrically connects the upper conductive pattern and the lower conductive pattern. An upper edge portion of the lower conductive pattern may be recessed relative to a lower edge portion of the lower conductive pattern to define a ledge thereon. The sidewall conductive pattern may be directly on the ledge and sidewall of the recessed upper edge portion of the lower conductive pattern.

4 Claims, 11 Drawing Sheets

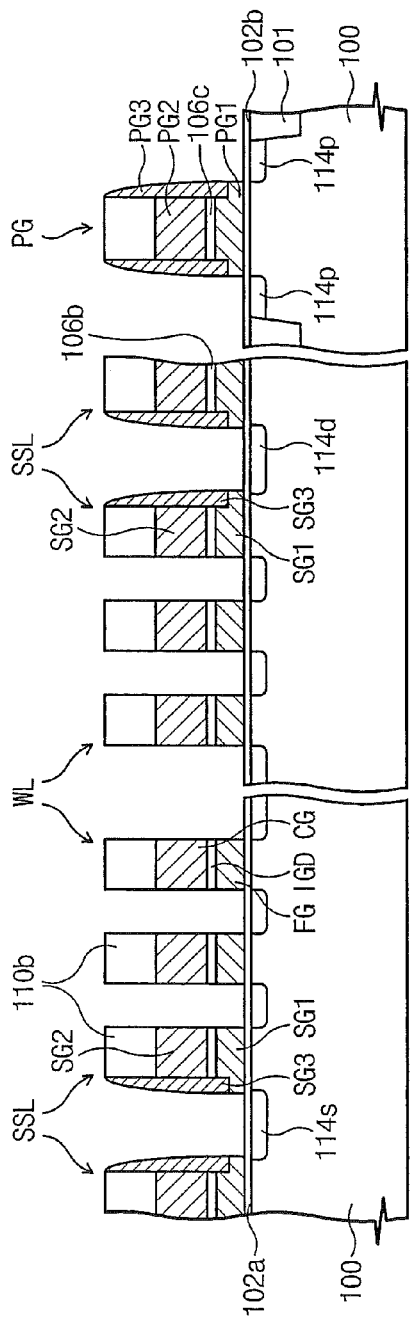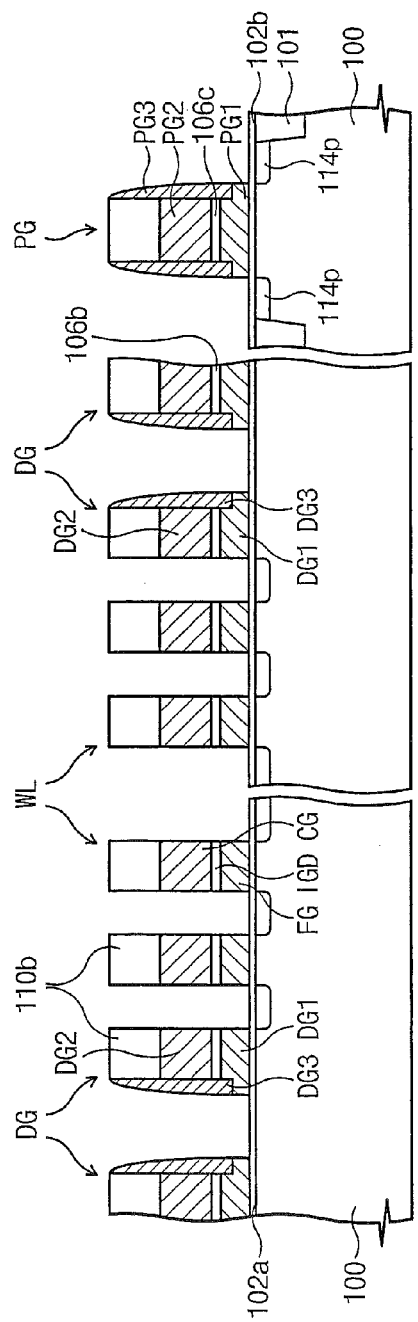

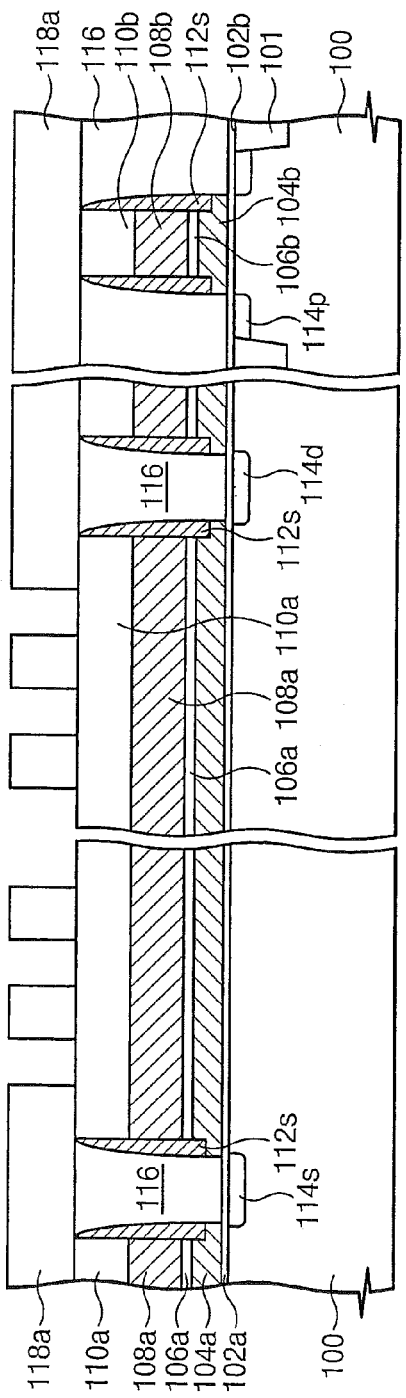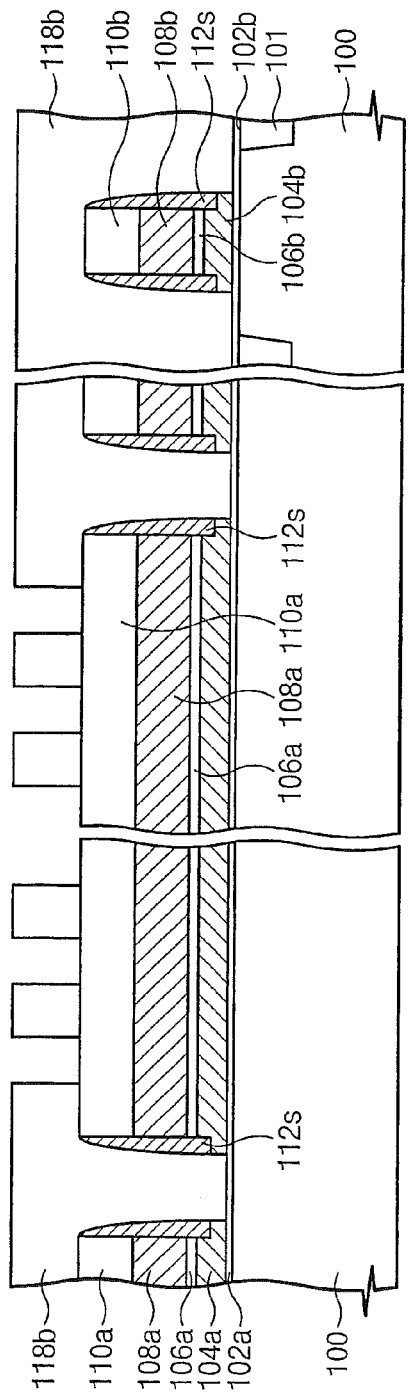

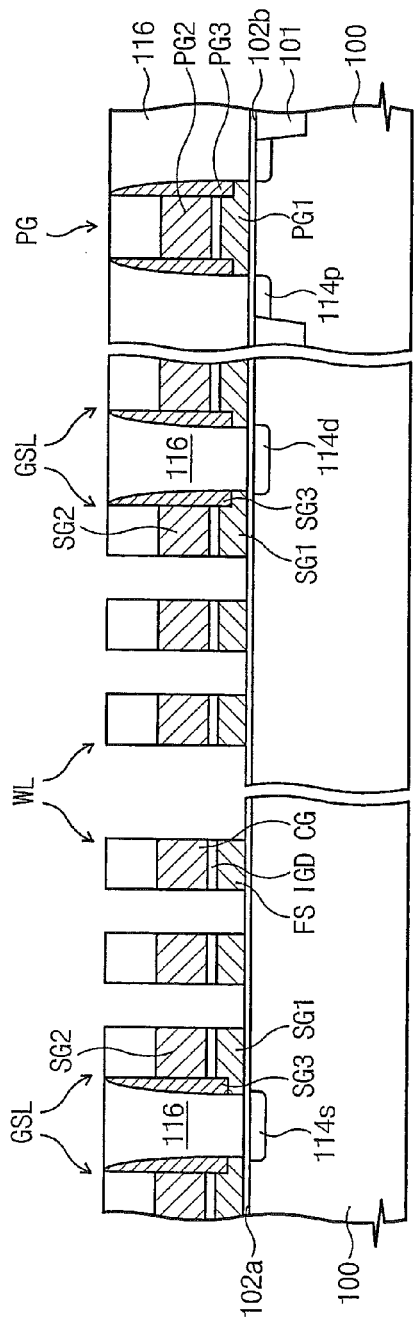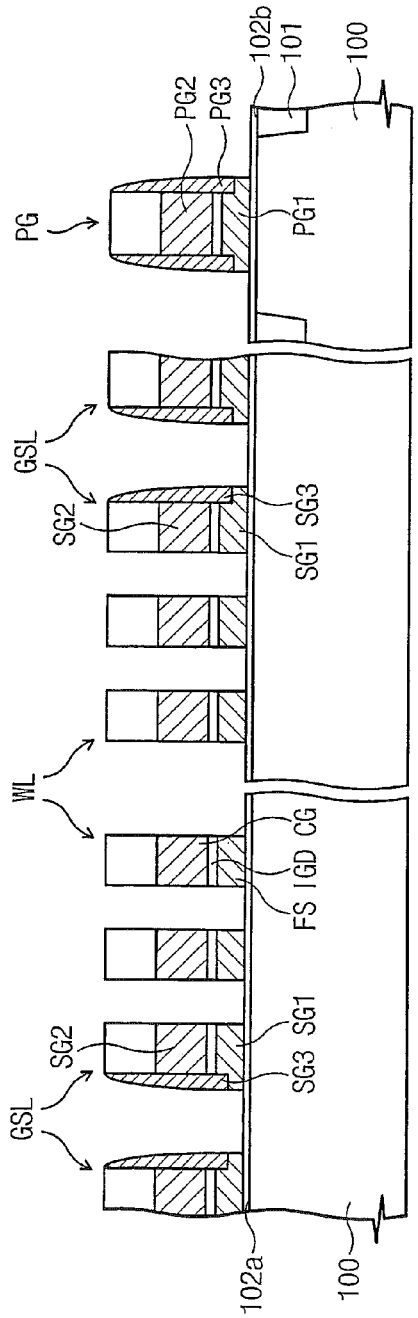

METHODS OF FABRICATING SEMICONDUCTOR DEVICES WITH SIDEWALL CONDUCTIVE PATTERNS

CROSS-REFERENCE TO RELATED APPLICATIONS

This is a divisional of U.S. application Ser. No. 12/133,146, filed Jun. 4, 2008 now U.S. Pat. No. 7,973,354, which itself is a continuation of U.S. application Ser. No. 11/241,458, filed Sep. 30, 2005 now U.S. Pat. No. 7,397,093, and which itself claims priority under 35 U.S.C. §119 of Korean Patent Application 10-2004-0089435 filed on Nov. 4, 2004, in the Korean Intellectual Property Office, the entire contents of which are hereby incorporated by reference.

FIELD OF THE INVENTION

The present invention relates to semiconductor devices and methods of fabricating the same. More particularly, the present invention relates to semiconductor transistors with stacked gates, some of which are electrically connected with one another, and methods of fabricating the same.

BACKGROUND OF THE INVENTION

Electrically erasable programmable read only memory (EEPROM) devices can store data in a nonvolatile manner as charges on stacked gates. Two types of EEPROM devices are flash memory devices and floating gate tunnel oxide (FLOTOX) memory devices. FLOTOX type EEPROM devices can have a unit memory cell with two transistors, one of which is a selection transistor configured to address a desired cell and the other of which is a memory transistor configured to store data. Flash type EEPROM devices can have a memory cell with one transistor. A cell array in a flash memory device can be classified as a NAND-type or a NOR-type depending upon the logic configuration of the memory cells. In a NAND-type cell array, a plurality of memory cells are serially connected to form cell strings, and a plurality of cell strings are connected in parallel with one another. Similar to FLOTOX type memory devices, two selection transistors are connected to opposite ends of a cell string of the NAND-type cell array. However, selection transistors of a FLOTOX type memory device select memory cells, while selection transistors of a NAND-type cell array select a cell string.

Transistors of a typical EEPROM cell include a lower conductive layer, an insulating layer, and an upper conductive layer that are sequentially stacked. The lower conductive layer and the upper conductive layer of a memory cell are electrically insulated from one another by the insulating layer so as to enable accumulation of charge on one of the conductive layers to store data. For selection transistors and peripheral transistors, the lower conductive layer and the upper conductive layer are electrically connected. Various different structures and related methods for electrically connecting lower and upper conductive layers have been suggested, such as illustrated by the EEPROM memory devices with selection transistors disclosed in U.S. Pat. Nos. 4,780,431 and 6,221,717.

FIGS. 1 through 3 are cross-sectional views of a conventional method of fabricating a semiconductor memory device.

With reference to FIG. 1, a field oxide layer 2 is formed on a semiconductor substrate 1. A gate insulating layer 3 and a first polysilicon layer 4 are formed on the substrate 1 between the field oxide layers 2. The field oxide layer 2 defines a cell region and a peripheral region of the substrate 1. An oxide layer 5 is formed on the first polysilicon layer 4. A resist mask 6 is formed on the resultant structure and defines windows 7 and 8 that expose portions of the oxide layer 5. The insulating layer 5 is etched using the resist mask 6 to form small windows 9 and 10 exposing portions of the gate insulating layer 3.

With reference to FIG. 2, the resist mask 6 is removed. A second polysilicon layer 11 is formed on a surface of the substrate 1. A cell transistor and resist masks 12, 13, and 14 are formed on the second polysilicon layer 11.

With reference to FIG. 3, the second polysilicon layer 11, the oxide layer 5 and the first polysilicon layer 4 are sequentially patterned using the resist masks 12, 13, and 14 to respectively form a cell transistor 15, a selection transistor 16, and a gate pattern of a peripheral transistor 17.

Accordingly, by forming the small windows 9 and 10 to remove portions of the oxide layer within the selection transistor 15 and the peripheral transistor 17, the polysilicon layers 4 and 11 therein can be electrically connected to each other through the widows 9 and 10. As can be appreciated, avoiding misalignment of such windows during fabrication can limit the integration density of such devices.

SUMMARY OF THE INVENTION

In some embodiments of the present invention, a gate pattern on a semiconductor substrate includes a lower conductive pattern, an upper conductive pattern, and a sidewall conductive pattern. The lower conductive pattern is on the substrate. The insulating pattern is on the lower conductive pattern. The upper conductive pattern is on the insulating pattern opposite to the lower conductive pattern. The sidewall conductive pattern is on at least a portion of sidewalls of the upper conductive pattern and the lower conductive pattern. The sidewall conductive pattern electrically connects the upper conductive pattern and the lower conductive pattern.

In some further embodiments, the sidewall conductive pattern may be directly on sidewalls of the upper conductive pattern and the lower conductive pattern. An upper edge portion of the lower conductive pattern may be recessed relative to a lower edge portion of the lower conductive pattern to define a ledge thereon, and the sidewall conductive pattern may be directly on the ledge and sidewall of the recessed upper edge portion of the lower conductive pattern. The recessed upper edge portion of the lower conductive pattern may have a sidewall that is self-aligned with an inner sidewall of the sidewall conductive pattern. The lower edge portion of the lower conductive pattern may have a sidewall that is self-aligned with an outer sidewall of the sidewall conductive pattern. The sidewall conductive pattern may or may not be directly on a sidewall surface of the lower edge portion of the lower conductive pattern.

In some other embodiments, a non-volatile memory device includes a semiconductor substrate with an active region defined therein. A plurality of gate lines and a plurality of word lines each cross over the active region. The plurality of the word lines are between adjacent pairs of the gate lines. Each gate line includes a lower gate pattern on the active region of the substrate, a gate interlayer insulating layer on the lower gate pattern, an upper gate pattern on the gate interlayer insulating layer opposite the lower gate pattern and crossing over the active region, and a sidewall gate pattern on, and electrically connecting, at least a portion of sidewalls of the upper gate pattern and the lower gate pattern. Each of the word lines includes a floating gate electrode on the active region, a gate interlayer dielectric layer on the floating gate electrode, and a control gate electrode on the gate interlayer dielectric layer opposite to the floating gate electrode and crossing over the active region.

Some other embodiments provide methods for forming a gate pattern on a semiconductor substrate. A first conductive layer is formed on the semiconductor substrate. An insulating layer is formed on the first conductive layer. A second conductive layer is formed on the insulating layer. The second conductive layer and the insulating layer are patterned to respectively form an upper conductive pattern and an insulating pattern. A third conductive layer is formed on exposed surfaces of the upper conductive pattern, the insulating pattern, and the first conductive layer. A portion of the third conductive layer is removed to form a sidewall conductive pattern on, and electrically connecting, at least a portion of sidewalls of the upper conductive pattern and the first conductive layer.

In some further embodiments, a portion of the first conductive layer may be etched to form a lower conductive pattern using the upper conductive pattern and the sidewall conductive pattern as an etch mask. The upper conductive pattern, the insulating pattern, and the lower conductive pattern may be patterned to form a gate pattern. The first conductive layer may be formed with an upper edge portion that is recessed relative to a lower edge portion to define a ledge thereon. The third conductive layer may be formed directly on the ledge and sidewall of the recessed upper edge portion of the first conductive layer. The recessed upper edge portion of the first conductive layer may have a sidewall that is self-aligned with an inner sidewall of the sidewall conductive pattern.

Some other embodiments provide methods of fabricating a non-volatile memory device. An active region is defined on a semiconductor substrate. A first conductive layer is formed on the active region of the substrate. An insulating layer is formed on the first conductive layer. A second conductive layer is formed on the insulating layer opposite the first conductive layer. A hard mask layer is formed on the insulating layer. The hard mask layer, the second conductive layer, and the insulating layer are patterned to respectively form a hard mask pattern, an upper conductive pattern and an insulating pattern. A third conductive layer is formed on exposed surfaces of the hard mask pattern, the upper conductive pattern, the insulating pattern, and the first conductive layer. A portion of the third conductive layer is anisotropically etched to form a sidewall conductive pattern on, and electrically connecting, at least a portion of sidewalls of the upper conductive pattern and the first conductive layer. A portion of the first conductive layer is etched to form a lower conductive pattern using the hard mask pattern and the sidewall conductive pattern as an etch mask. The hard mask pattern, the upper conductive pattern, the insulating pattern, and the lower conductive pattern are patterned to form a plurality of gate lines and a plurality of word lines. The gate lines cross over the active region. A plurality of the word lines are between adjacent pairs of the gate lines and cross over the active region.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings:

FIG. 11A is a cross-sectional view taken along line II-II' of the semiconductor device of FIG. 9 in accordance with some embodiment of the present invention;

FIG. 11B is a cross-sectional view taken along line III-III' of the semiconductor device of FIG. 19 in accordance with some embodiments of the present invention;

FIGS. 12 through 14, 15A, 15B, 16A, and 16B are cross-sectional views illustrating methods of fabricating the semiconductor devices of FIGS. 9 and 10 in accordance with some embodiments of the present invention.

DETAILED DESCRIPTION OF EMBODIMENTS OF THE INVENTION

Figure 1:
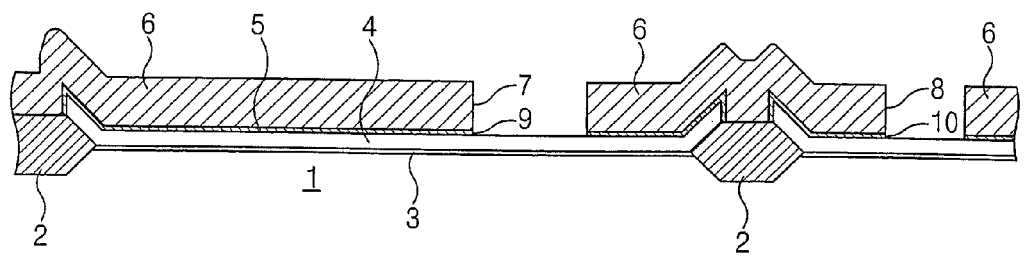
FIGS. 1 through 3 are cross-sectional views of a conventional method of fabricating a semiconductor memory device.
Figure 2:
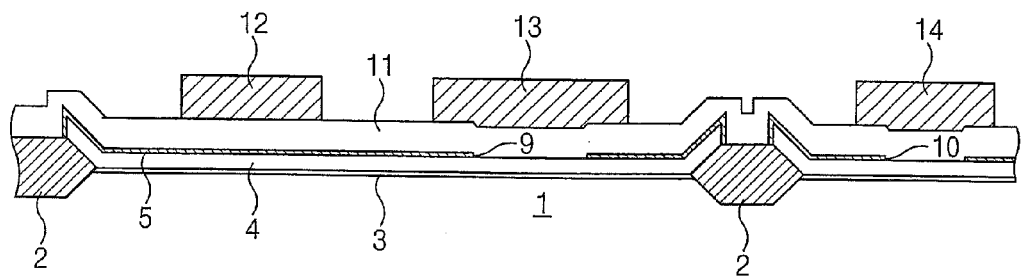
Figure 3:
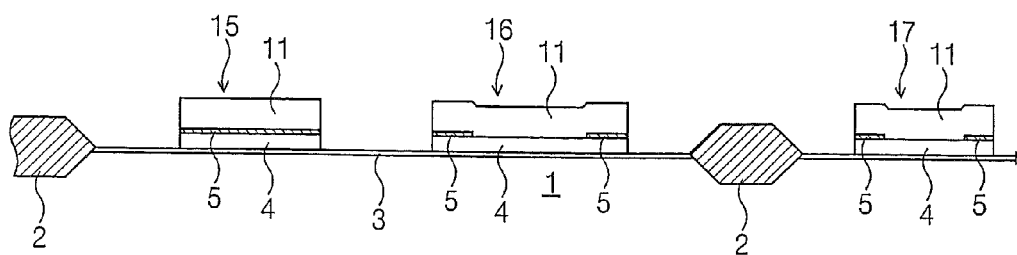

While the invention is susceptible to various modifications and alternative forms, specific embodiments thereof are shown by way of example in the drawings and will be described in detail herein. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the drawings.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4A:
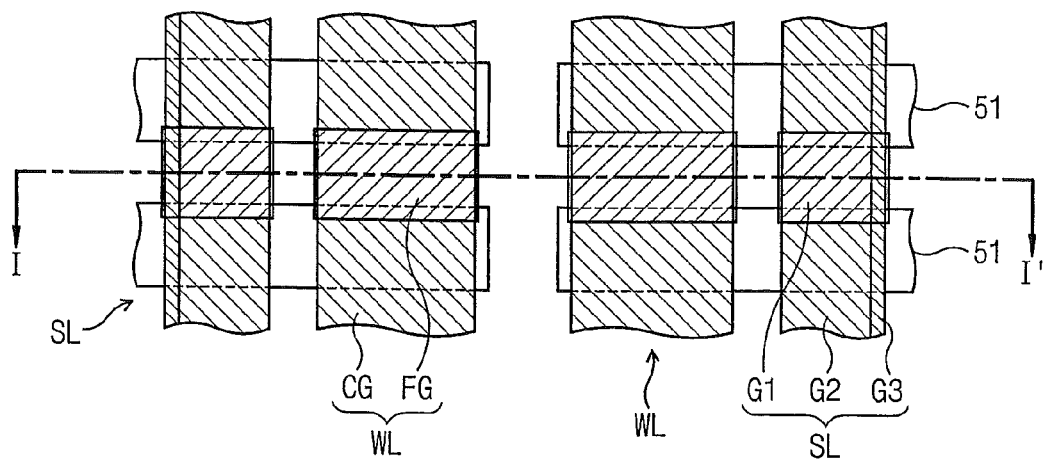
FIG. 4A is a cross-sectional view illustrating a semiconductor device in accordance with some embodiments of the present invention.

FIG. 4A is a cross-sectional view illustrating a semiconductor device in accordance with some embodiments of the present invention.

Figure 4B:
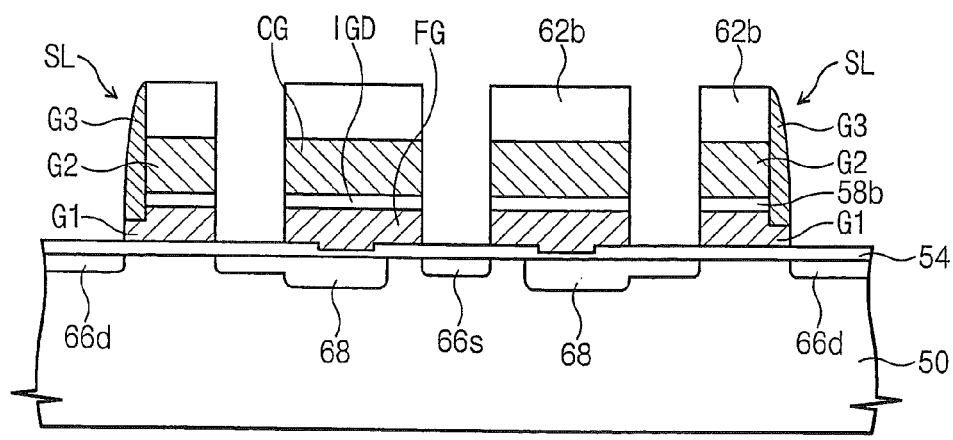
FIG. 4B is a cross-sectional view taken along line I-I' of the semiconductor device of FIG. 4A.

FIG. 4B is a cross-sectional view taken along line I-I' of the semiconductor device of FIG. 4A.

The semiconductor device shown in FIGS. 4A and 4B may be used in a FLOTOX EEPROM. With reference to FIGS. 4A and 4B, a device isolation layer 51 is formed on a semiconductor substrate 50 to define an active region of the substrate 50. Selection gate lines SL cross over the active region of the substrate 50. Word lines WL cross over the active region of the substrate 50 between an adjacent pair of the selection gate lines SL.

Each of the selection gate lines SL include a lower gate pattern G1, an upper gate pattern G2, a gate interlayer insulating layer 58b, and a sidewall gate pattern G3. A gate insulating layer 54 is on the substrate 50 and insulates the lower gate pattern G1 from the active region of the substrate 50. The upper gate pattern G2 is on the lower gate pattern G1 and crosses over the active region. The gate interlayer insulating layer 58b is interposed between the upper gate pattern G2 and the lower gate pattern G1. The sidewall gate pattern G3 is on at least a portion of sidewalls of the upper gate pattern G2 and the lower gate pattern G1, and electrically connects the upper gate pattern G2 and the lower gate pattern G1.

The word line WL includes a floating gate FG, a control gate electrode CG, and an interlayer dielectric layer IGD. The floating gate FG is formed on the active region. The control gate electrode CG is formed on the floating gate FG and crosses over the active region. The interlayer dielectric layer IDG is interposed between the floating gate FG and the control gate electrode CG.

The lower gate pattern G1 has a portion of its sidewall self-aligned with a sidewall of the sidewall gate pattern G3. As shown in FIGS. 4A and 4B, an upper edge portion of the lower gate pattern G1 is recessed relative to a lower edge portion of the lower gate pattern G1 to define a ledge along the edge portion. The sidewall gate pattern G3 is formed on the ledge of the lower gate pattern G1, which may provide an increased contact area between the sidewall gate pattern G3 and the lower gate pattern G1. Accordingly, the recessed upper portion of the lower gate pattern G1 can have a sidewall that is self-aligned with an inner sidewall of the sidewall gate pattern G3. The lower edge portion of the lower conductive pattern, which is not recessed, can have a sidewall that is self-aligned with an outer sidewall of the sidewall conductive pattern.

A capping insulating pattern 62b may be formed on an upper portion of the upper gate pattern G2. The sidewall gate pattern G3 may extend along at least a portion of sidewalls of the capping insulating pattern 62b and the upper gate pattern G2. The sidewall gate pattern G3 may be formed by a spacer formation process.

The floating gate FG can be formed on the gate insulating layer 54 which provides a thin tunneling region through which charges can tunnel between the active region and the floating gate FG. A common source region is formed in the substrate 50 between the word lines WL. A floating diffusion layer 68 is formed in the substrate 50 between the word line WL and the selection gate line SL. A drain region 66d is formed in the active region adjacent to the selection gate line SL.

FIGS. 5 through 8 are cross-sectional views that illustrate methods of fabricating the semiconductor device shown in FIGS. 4A-B in accordance with some embodiments of the present invention.

Figure 5:
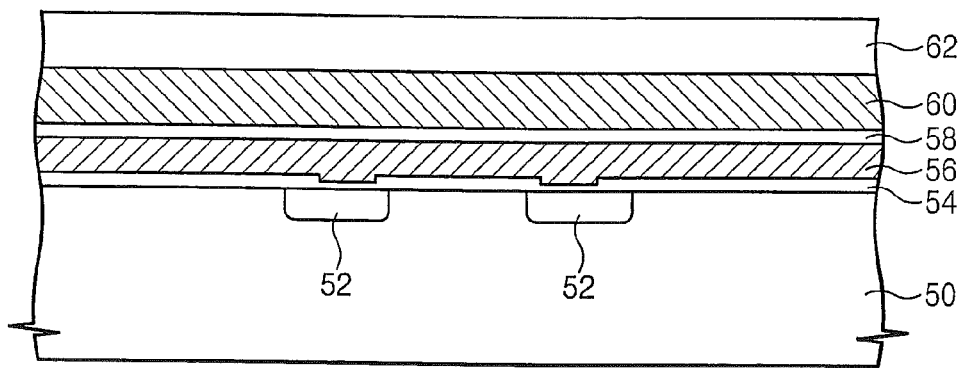
FIGS. 5 through 8 are cross-sectional views illustrating methods of fabricating the semiconductor device of FIGS. 4A-B in accordance with some embodiment of the present invention.

With reference to FIG. 5, a device isolation layer (not shown) is formed on the semiconductor substrate 50 to define an active region therein. Impurities are implanted into a portion of the active region to form a cell diffusion layer 52. The gate insulating layer 54 is formed on the active region. A first conductive layer 56 is formed on an entire surface of the substrate 50. The first conductive layer 56 is patterned to remove it from the device isolation layer while remaining on the active region. An insulating layer 58 and a second conductive layer 60 are formed on the first conductive layer 56. A hard mask layer 62 may be formed on the second conductive layer 60. The gate insulating layer 54 includes a tunneling region over the cell diffusion layer 52 that is sufficiently thin to allow charge tunneling therethrough. These processes described above in this paragraph may be carried out according to those used in conventional FLOTOX EEPROM fabrication.

Figure 6:
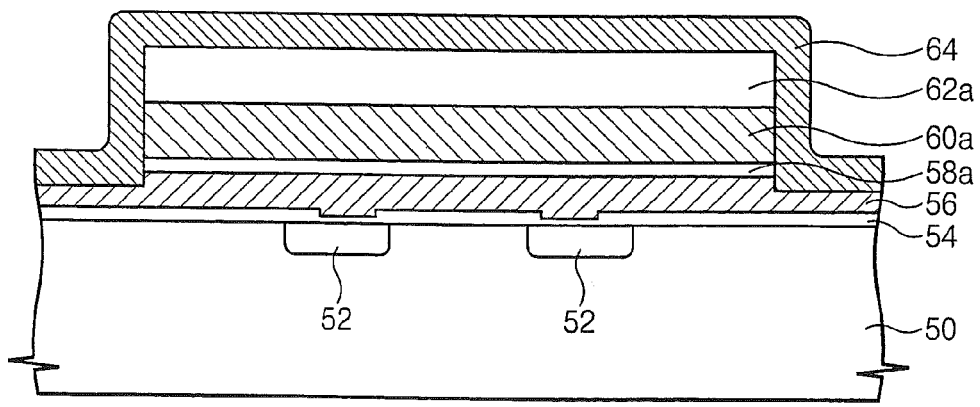

With reference to FIG. 6, the hard mask layer 62, the second conductive layer 60, and the insulating layer 58 are patterned to form a hard mask pattern 62a, a second conductive pattern 62a, and an insulating pattern 58a. An upper edge portion of the first conductive layer 56 is further etched so it is recessed relative to a lower edge portion of the first conductive layer 56 and thereby defines a ledge along the edge of the first conductive layer 56. In some embodiments, the gate insulating layer 54 is not exposed when etching the edge portion of the first conductive layer 56.

A third conductive layer 64 is conformally formed across the hard mask pattern 62a and the other resultant structure. The third conductive layer 64 can be formed of a material having an etch selectivity with respect to the first conductive layer 56. The first conductive layer 56 and the second conductive layer 60, which will respectively become a floating gate and a control gate electrode, are generally formed from polysilicon. The third conductive layer 64 may be formed from a metal that may include, for example, tungsten, titanium, and/or tantalum.

Figure 7:
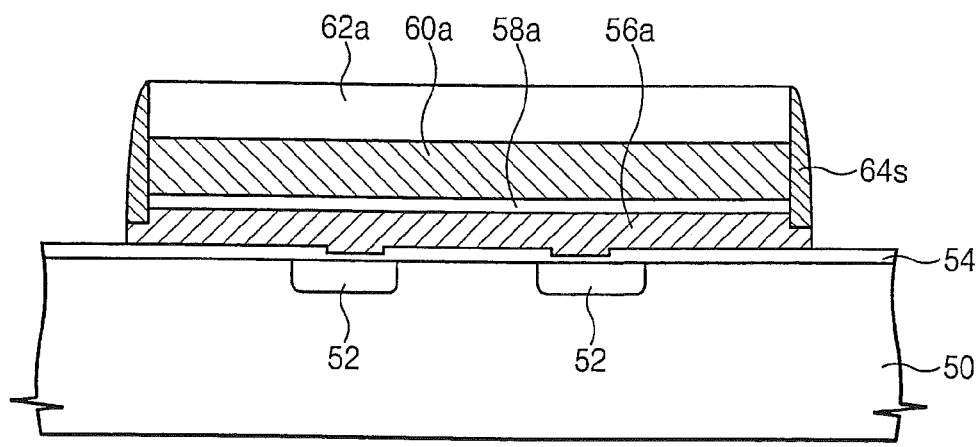

With reference to FIG. 7, the third conductive layer 64 is anisotropically etched to form a sidewall conductive pattern 64s along a sidewall of the second conductive pattern 60a. The sidewall conductive pattern 64s can be shaped similar to a spacer pattern. The first conductive layer 56 is patterned using the hard mask pattern 64a and the sidewall conductive pattern 64s as an etch mask.

Figure 8:
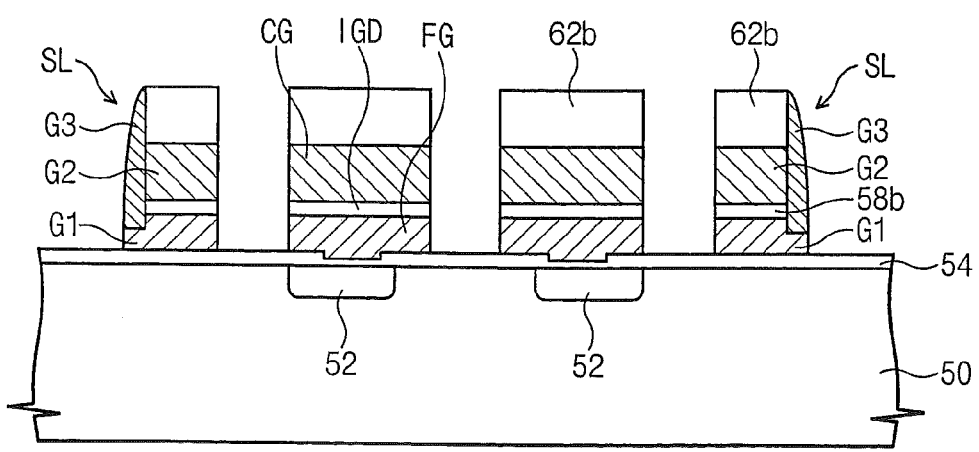

With reference to FIG. 8, the hard mask pattern 62a, the second conductive pattern 60a, and the insulating pattern 58a are sequentially patterned to form a plurality of selection gate lines SL and a plurality of word lines WL. The selection gate lines SL cross over the active region of the substrate 50, and the word lines WL are arranged between the selection gate lines SL and cross over the active region. The word lines WL may have the same structure as that of a conventional FLOTOX EEPORM. In contrast, the selection gate line SL can include stacked upper and lower conductive layers with an insulating layer therebetween, and with the upper and lower conductive layers electrically connected by a sidewall conductive layer.

More particularly, each of the word lines WL can include the floating gate FG, the control gate electrode CG, and the gate interlayer insulating layer IGD. The gate insulating layer is formed on the active region of the substrate 50, and the floating gate FG is formed on a portion of the gate insulating layer 54 on the active region. The control gate electrode CG is formed on the floating gate FG and crosses over the active region. The gate interlayer insulating layer IGD is between the control gate electrode CG and the floating gate FG. The selection gate line SL can include the lower gate pattern G1, the upper gate pattern G2, the gate interlayer insulating layer 58b, and the sidewall gate pattern G3. The lower gate pattern G1 is formed on a portion of the gate insulating layer 54 on the active region. The upper gate pattern G1 is formed on an upper portion of the lower gate pattern G1 and crosses over the active region. The gate interlayer insulating layer 58b is between the upper gate pattern G2 and the lower gate pattern G1. The sidewall gate pattern G3 is formed on a sidewall of both of the upper and lower gate patterns G2,G1 to electrically connect the upper gate pattern G2 and the lower gate pattern G1. The sidewall gate pattern G3 may be formed by a conventional process used to form a spacer along a sidewall of a gate pattern and, therefore, may be formed from a thin conductive layer.

Impurities are implanted into a portion of the active region adjacent both sides of the word line WL and the selection gate line SL to form the source region 66s, the drain region 66d, and the floating diffusion layer 68 as shown in FIG. 4.

The illustrated embodiments of semiconductor device and methods shown in FIGS. 4-8 are not limited to FLOTOX type EEPROMs. They may be used to other non-volatile memory devices that include transistor devices having stacked gate structures with upper and lower conductive layers. Moreover, the structure of these embodiments may be alternatively configured as needed to provide different shaped cell arrays.

Figure 9:
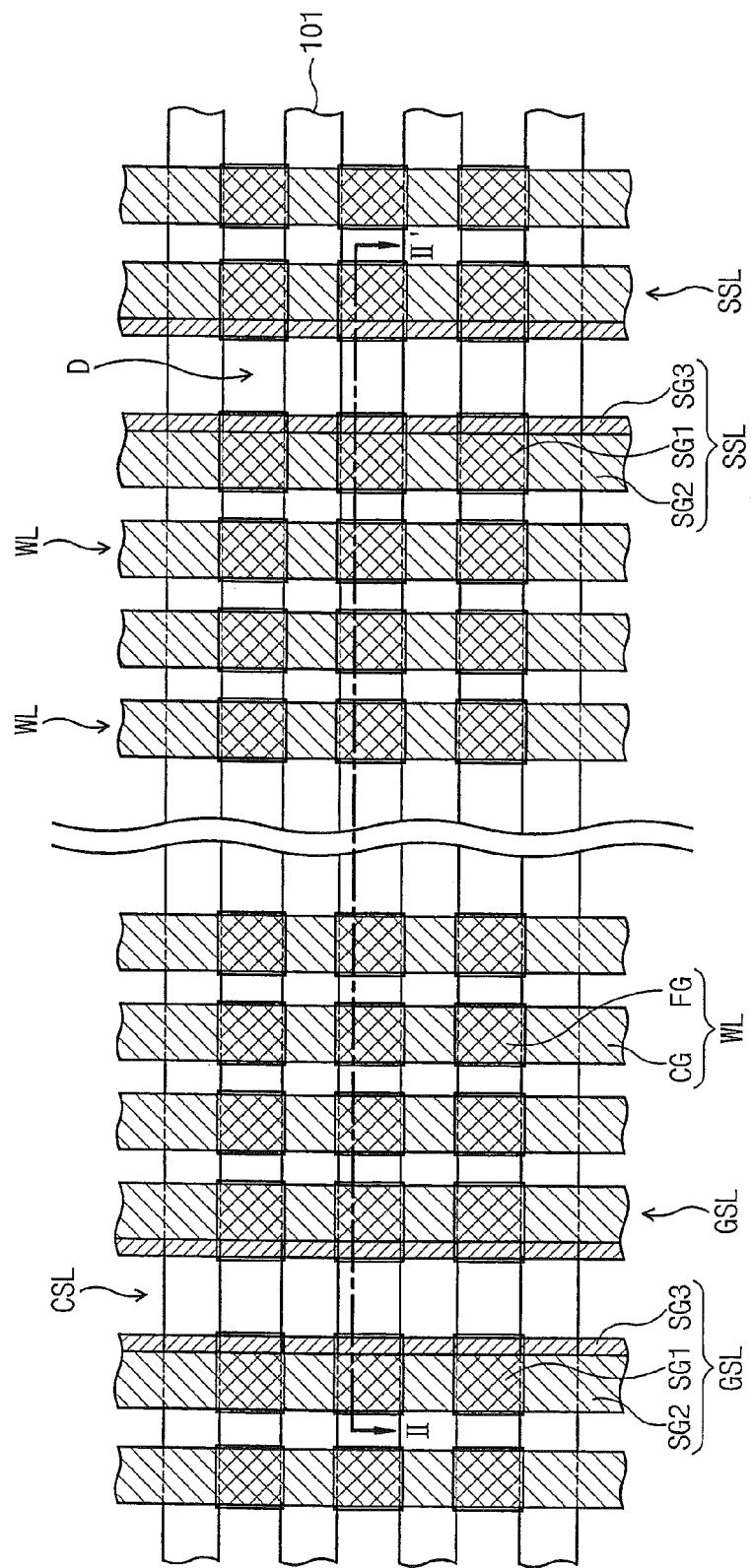
FIGS. 9 and 10 are plan views showing semiconductor devices in accordance with some embodiments of the present invention.
Figure 10:
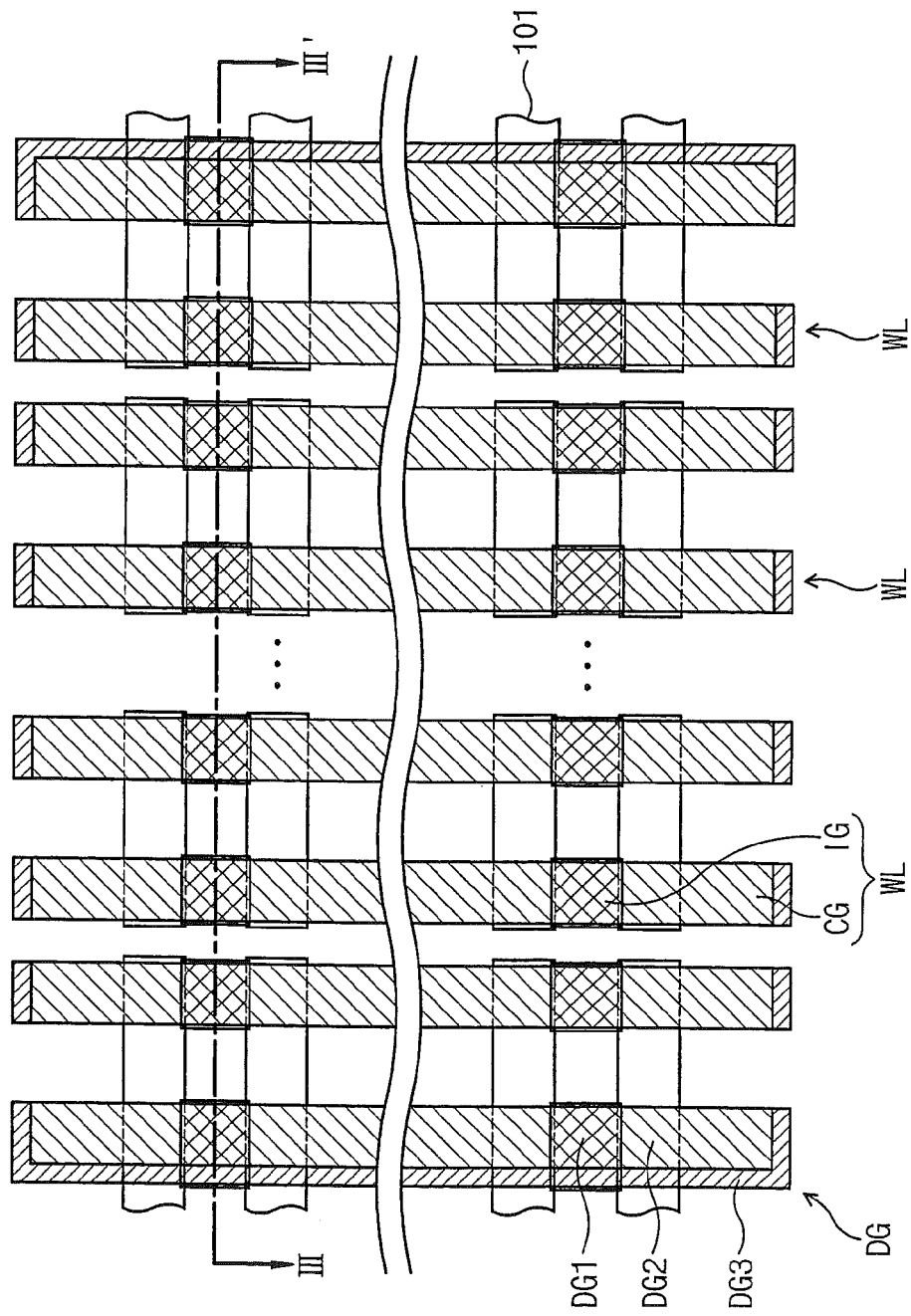

FIGS. 9 and 10 are plan views showing a semiconductor device in accordance with some embodiments of the present invention.

FIG. 11A is a cross-sectional view taken along line II-II' of the semiconductor device of FIG. 9, including a peripheral circuit, in accordance with some embodiments of the present invention;

FIG. 11B is a cross-sectional view taken along line III-III' of the semiconductor device of FIG. 19, including a peripheral circuit, in accordance with some embodiments of the present invention;

FIG. 9 is a plan view that shows a cell block of a NAND-type non-volatile memory device according to some embodiments of the present invention. FIG. 10 is a plan view showing a cell block of a NOR-type non-volatile memory device according to some embodiments of the present invention.

With reference to FIGS. 9 and 11A, the NAND-type non-volatile memory device includes a plurality of device isolation layers 101 defining active regions, a plurality of the gate lines SSL and GSL that cross over the active regions, and a plurality of the word lines WL between the gate selection line SSL and GSL and that cross over the active regions.

Each word line WL can include the control gate electrode CG that crosses over the active region and the floating gate FG between the control gate electrode CG and the active regions. The selection gate lines SSL and GSL can each include the upper gate pattern SG2 that crosses over the active regions, the lower gate pattern SG1 between the upper gate pattern SG2 and the active regions, and the sidewall gate pattern SG3 along at least a portion of sidewalls of the upper gate pattern SG2 and the lower gate pattern SG1.

Similar to a conventional NAND-type non-volatile memory device, the selection gate lines GSL and SSL may be respectively configured as a ground selection line and a string selection line. A common source line (CSL) is formed on the active regions between adjacent GSLs. A drain D is formed on an active region between adjacent SSLs.

With reference to FIG. 11A, the lower gate pattern SG1 can have an upper edge portion that is recessed relative to a lower edge portion to define a ledge, such as shown in FIG. 6, on the sidewall gate pattern SG3 may be formed. A gate electrode PG of a peripheral circuit transistor can include a lower conductive pattern PG1 and an upper conductive pattern PG2, and a sidewall conductive pattern PG3. An insulating pattern 106c is between the lower and upper conductive patterns PG1 and PG2. The sidewall conductive pattern PG3 is formed on at least a portion of sidewalls of the upper conductive pattern PG2 and the lower conductive pattern PG1 to electrically connect the upper conductive pattern PG2 and the lower conductive pattern PG1.

With reference to FIGS. 10 and 11B, a plurality of cell blocks are arranged in a matrix to form a cell array of a NOR-type non-volatile memory device. Each of cell blocks includes a device isolation layer 101 that defines an active region of the substrate 100 and a plurality of word lines that cross over the active region. Each word line WL includes a floating gate FG on the active region and a control gate electrode CG on the floating gate FG.

Word lines along the edge of groups of cell blocks are dummy word lines DG. The dummy word lines DG can each be configured as one of the sidewall pattern DG3. Accordingly, a control gate electrode DG2 and a floating gate DG1 of aligned ones of the cell blocks may be electrically connected through a respective one of the dummy word lines DG.

NOR-type and NAND-type non-volatile memory devices can include peripheral circuit transistors. As shown in FIG. 11B, a gate electrode PG of a peripheral circuit transistor includes a lower conductive pattern PG1 and an upper conductive pattern PG2, and a sidewall conductive pattern PG3. An insulating pattern 106b is between the lower conductive patterns PG1 and the upper conductive pattern PG2. The sidewall conductive pattern PG3 is formed on at least a portion of sidewalls of the upper and lower conductive patterns PG2, PG1 to electrically connect the upper conductive pattern PG2 and the lower conductive pattern PG1. Unlike a NAND-type non-volatile memory device, a cell array of a NOR-type non-volatile memory device does not need a selection gate. A dummy gate line along the edge of a group of cell blocks forms a sidewall gate pattern SG3.

FIGS. 12 through 14, 15A, 15B, 16A, and 16B are cross-sectional views that illustrating methods of fabricating semiconductor devices in accordance with some embodiments of the present invention.

Figure 12:
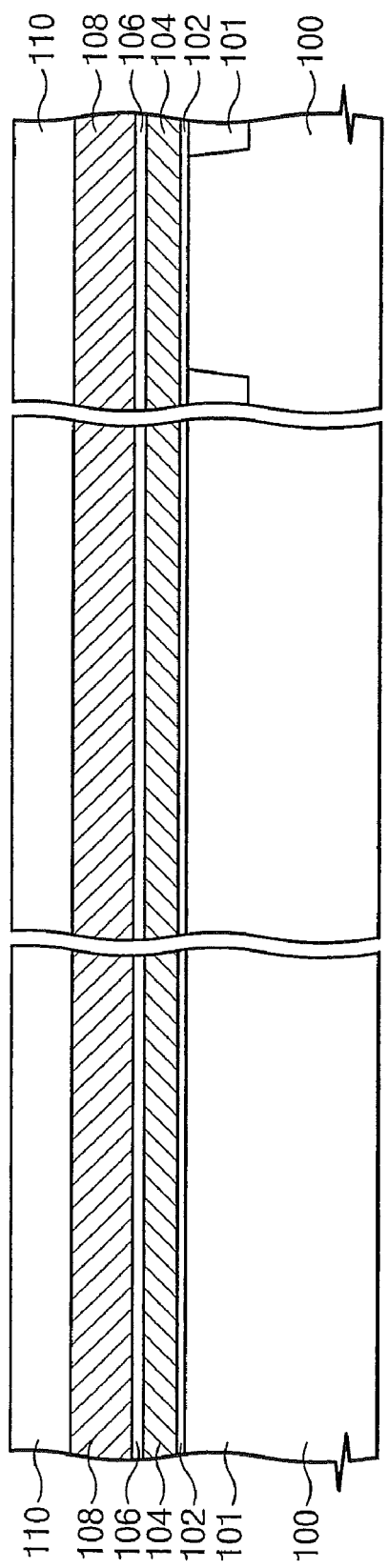

With reference to FIG. 12, device isolation layers 101 are formed on a semiconductor substrate 100 to define an active region. A peripheral region and a cell array region are also defined on the substrate 100. A gate insulating layer 102 is formed on the active region. A first conductive layer 104 is formed on the substrate 100. The first conductive layer 104 is patterned to remove it from on a device isolation layer (not shown) in the cell array region. An insulating layer 106, a second conductive layer 108, and a hard mask layer 110 are formed on the first conductive layer 104. The processes described above in this paragraph with regard to FIG. 10 may be carried in accordance with convention processes used to fabricate FLOTOX EEPROMs.

Figure 13:
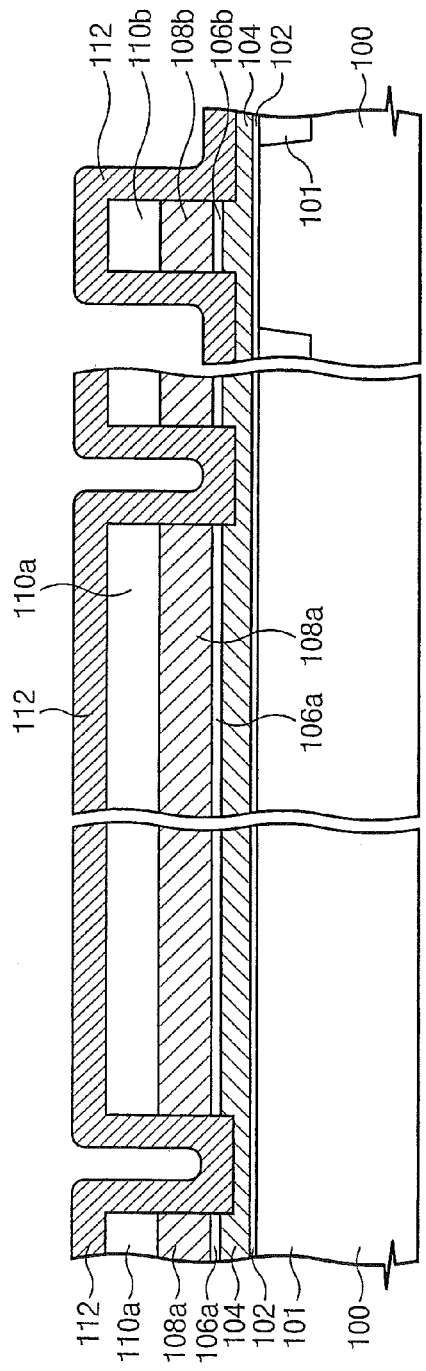

With reference to FIG. 13, the hard mask layer 110, the second conductive layer 108, and the insulating layer 106 are patterned to form a first hard mask pattern 110a, a second conductive pattern 108a, and a first insulating pattern 106a. A second hard mask pattern 110b, an upper conductive pattern 108b, and a second insulating pattern 106b are formed in the peripheral circuit region of the substrate 100. An upper edge portion of the first conductive layer 104 may be recessed relative to a lower edge portion of the first conductive layer 104, such as by an etching process, to define a ledge.

A third conductive layer 112 is formed on the second hard mask pattern 110b, and may be conformally formed on an entire surface of the resultant structure. The third conductive layer 112 may be formed from a material having an etch selectivity with respect to that of the first conductive layer 104. The first and second conductive layers 104 and 108, which respectively form a floating gate and a control gate electrode, may be formed from polysilicon. The third conducive layer 112 may be formed from a metal such as, for example, tungsten, titanium, and/or tantalum.

Figure 14:
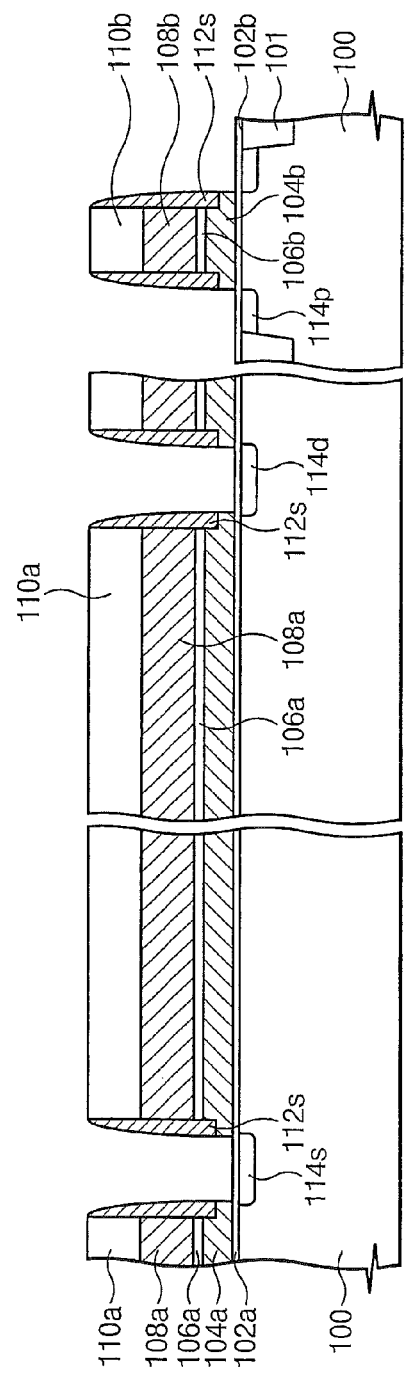

With reference to FIG. 14, the third conductive layer 112 is anisotropically etched the form a sidewall conductive pattern 112s along sidewalls of the second conductive pattern 108a and the first conductive pattern 104a in the peripheral region of the substrate 100, and a sidewall conductive pattern 112s along sidewalls of the upper conductive pattern 108b and the lower conductive pattern 104b in the cell array region of the substrate 100. The sidewall conductive patterns 112s can have a similar shape to a conventional spacer pattern. The first conductive layer 104 is patterned using the first hard mask pattern 110a, the second hard mask pattern 110b, the first sidewall conducive pattern 112s, and the second sidewall conductive pattern 112s as an etch mask. As a result, a first conductive pattern 104a is formed in the cell array region, and a lower conductive pattern 104b is formed in the peripheral circuit region. The lower conductive pattern 104b, the second insulating pattern 106b, the upper conductive pattern 108b, and the second sidewall conductive pattern 112s can form a gate electrode in the peripheral circuit region. Impurities are implanted into the substrate 100 to form a first source region 114s and a first drain region 114b in the cell array region. Source/drain regions 114p are formed in the peripheral region of the substrate 100. The source/drain regions may be formed after formation of a word line.

With reference to FIG. 15A, an interlayer insulating layer 116 can be formed on an entire surface of the substrate and then planarized to expose an upper surface of the first and second hard mask patterns 110a and 110b. A photoresist pattern 118a configured to define a word line and a selection gate line is formed on the first and second hard mask patterns 110a and 110b and the interlayer insulating layer 116.

With reference to FIG. 16A, the first and second hard mask patterns 110a and 110b, the first insulating pattern 106a and the first conductive pattern 104a are sequentially patterned to form a plurality of selection gate lines SSL and GSL and a plurality of word lines WL. The selection gate lines SSL and GSL cross over the active regions. The plurality of word lines WL are between the selection gate lines SSL and GSL and cross over the active regions. The word line WL may include the same structure as a word line of a conventional non-volatile memory device. The selection gate lines SSL and GSL may include a lower conductive layer, an insulating layer on the lower conductive layer, an upper conductive layer on the insulating layer, and a sidewall conductive layer that electrically connects sidewalls of the upper and lower conductive layers. The first hard mask pattern 110a and the second hard mask pattern 110b may form a capping pattern of a gate electrode.

The word line WL can include a gate insulating layer 102, a floating gate FG, a gate interlayer dielectric layer IGD, and a control gate electrode CG. The gate insulating layer 102 is on the active regions of the substrate 100. The floating gate FG is on the gate insulating layer 102 on an active region. The control gate electrode CG is on the floating gate FG and crosses over the active region. The gate interlayer dielectric layer IGD is between the control gate electrode CG and the floating gate FG.

The selection gate lines SSL and GSL can include a lower gate pattern SG1 that includes a gate insulating layer 102, a lower gate pattern SG1, an interlayer insulating layer 106b, an upper gate pattern SG2, and a sidewall gate pattern SG3. The gate insulating layer 102 is on the active regions of the substrate 100. The lower gate pattern SG1 is on the gate insulating layer 102 on an active region. The upper gate pattern SG2 is on the lower gate pattern SG1 and crosses over the active region. The interlayer insulating layer 106b is between the lower gate pattern SG1 and the upper gate pattern SG2. The sidewall gate pattern SG3 is on, and electrically connects, at least a portion of sidewalls of the lower gate pattern SG1 and the upper gate pattern SG2, and electrically connects the lower gate pattern SG1 and the upper gate pattern SG2.

In another embodiment of the present invention, a photoresist pattern 118b configured to define a word line and a selection line may be formed as shown in FIG. 15B without forming the interlayer insulating layer 116 shown in FIG. 15A. Because the active region is not covered with an interlayer insulating layer, the source and drain regions may be formed after forming the word line and the selection gate line, such as shown in FIG. 16B. Impurities are implanted into an active region of the substrate 100 adjacent both sides of the word line WL and the selection gate lines SSL and GSL to form the source region 114s, the drain region 114d, and the floating diffusion layer, which are shown in FIG. 11A.

Although FIGS. 12-16 have been discussed above with regard to NAND-type non-volatile memory devices, it will be appreciated to one of skill in the art that the methods described herein may also be used to fabricate other types of memory devices, such as NOR-type non-volatile memory devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a non-volatile memory device, the method comprising:
    defining an active region on a semiconductor substrate;
    forming a first conductive layer on the active region of the substrate;
    forming an insulating layer on the first conductive layer;
    forming a second conductive layer on the insulating layer opposite the first conductive layer;
    forming a hard mask layer on the insulating layer;
    patterning the hard mask layer, the second conductive layer, and the insulating layer to respectively form a hard mask pattern, an upper conductive pattern and an insulating pattern;
    forming a third conductive layer on exposed surfaces of the hard mask pattern, the upper conductive pattern, the insulating pattern, and the first conductive layer;
    anisotropically etching a portion of the third conductive layer to form a sidewall conductive pattern on, and electrically connecting, at least a portion of sidewalls of the upper conductive pattern and the first conductive layer;
    etching a portion of the first conductive layer to form a lower conductive pattern using the hard mask pattern and the sidewall conductive pattern as an etch mask; and
    patterning the hard mask pattern, the upper conductive pattern, the insulating pattern, and the lower conductive pattern to form a plurality of gate lines and a plurality of word lines, wherein the gate lines cross over the active region, and wherein a plurality of the word lines are between adjacent pairs of the gate lines and cross over the active region.

2. The method of claim 1, wherein:
    each of the formed gate lines comprise the upper conductive pattern, the insulating pattern, the lower conductive pattern, and the sidewall conductive pattern; and
    each of the formed word lines comprise the upper conductive pattern, the insulating pattern, and the lower conductive pattern.

3. The method of claim 1, further comprising forming the first conductive layer with an upper edge portion that is recessed relative to a lower edge portion to define a ledge thereon, wherein the third conductive layer is formed directly on the ledge and sidewall of the recessed upper edge portion of the first conductive layer.

4. The method of claim 3, wherein the recessed upper edge portion of the first conductive layer has a sidewall that is self-aligned with an inner sidewall of the sidewall conductive pattern.

* * * * *